(12) United States Patent
Botula et al.

(10) Patent No.: US 8,674,472 B2
(45) Date of Patent: Mar. 18, 2014

(54) LOW HARMONIC RF SWITCH IN SOI

(75) Inventors: Alan B. Botula, Essex Junction, VT (US); Dinh Dang, Essex Junction, VT (US); James S. Dunn, Jericho, VT (US); Alvin J. Joseph, Williston, VT (US); Peter J. Lindgren, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 12/853,532

(22) Filed: Aug. 10, 2010

(65) Prior Publication Data
US 2012/0038024 A1 Feb. 16, 2012

(51) Int. Cl.
*H01L 21/764* (2006.01)

(52) U.S. Cl.
USPC ............... 257/522; 257/E21.564; 438/296; 438/422

(58) Field of Classification Search
USPC ............... 257/522, E21.564; 438/296, 422
See application file for complete search history.

(56) References Cited

U.S. PATENT DOCUMENTS

| | | | |
|---|---|---|---|
| 5,057,450 A | 10/1991 | Bronner et al. | |
| 5,227,658 A | 7/1993 | Beyer et al. | |
| 5,232,866 A | 8/1993 | Beyer et al. | |
| 5,801,089 A | 9/1998 | Kenney | |
| 5,943,581 A | 8/1999 | Lu et al. | |
| 6,051,866 A * | 4/2000 | Shaw et al. | 257/417 |
| 6,342,430 B1 | 1/2002 | Adams et al. | |
| 6,461,903 B2 * | 10/2002 | Lee | 438/164 |
| 6,955,988 B2 | 10/2005 | Nevin et al. | |
| 7,084,028 B2 | 8/2006 | Fukuzumi | |
| 7,190,007 B2 * | 3/2007 | Breitwisch et al. | 257/149 |
| 7,326,983 B2 | 2/2008 | Steegen et al. | |
| 7,396,732 B2 * | 7/2008 | Kunnen | 438/322 |
| 7,521,776 B2 | 4/2009 | Cannon et al. | |
| 7,927,963 B2 | 4/2011 | Brown et al. | |
| 2001/0000914 A1 * | 5/2001 | Park et al. | 257/1 |
| 2002/0063341 A1 * | 5/2002 | Fukumi | 257/777 |
| 2002/0081793 A1 * | 6/2002 | Yang et al. | 438/200 |
| 2002/0132448 A1 * | 9/2002 | Lim et al. | 438/456 |
| 2004/0124439 A1 * | 7/2004 | Minami et al. | 257/200 |
| 2004/0129998 A1 * | 7/2004 | Inoh et al. | 257/501 |
| 2005/0176222 A1 * | 8/2005 | Ogura | 438/514 |
| 2005/0224714 A1 * | 10/2005 | Akin et al. | 250/332 |
| 2008/0029818 A1 | 2/2008 | Steegen et al. | |
| 2009/0032874 A1 | 2/2009 | Loubet et al. | |
| 2010/0035403 A1 | 2/2010 | Brown et al. | |
| 2010/0109120 A1 * | 5/2010 | Fucsko et al. | 257/507 |
| 2010/0314668 A1 * | 12/2010 | Ollier et al. | 257/252 |
| 2011/0117747 A1 * | 5/2011 | Wey et al. | 438/710 |

OTHER PUBLICATIONS

Office Action dated May 24, 2013 in U.S. Appl. No. 13/832,929; 10 Pages.
Notice of Allowance dated Jan. 3, 2014 in U.S. Appl. No. 13/832,929; 8 pages.

\* cited by examiner

*Primary Examiner* — Steven J Fulk
(74) *Attorney, Agent, or Firm* — David Cain; Roberts Mlotkowski Safran & Cole, P.C.

(57) ABSTRACT

A low harmonic radio-frequency (RF) switch in a silicon-on-insulator (SOI) substrate and methods of manufacture. A method includes forming at least one trench through an insulator layer. The at least one trench is adjacent a device formed in an active region on the insulator layer. The method also includes forming at least one cavity in a substrate under the insulator layer and extending laterally from the at least one trench to underneath the device.

19 Claims, 10 Drawing Sheets

LOW HARMONIC RF SWITCH IN SOI

FIELD OF THE INVENTION

The invention relates to a semiconductor structures and methods of manufacture and, more particularly, to an integrated circuit having a low harmonic radio-frequency (RF) switch in a silicon-on-insulator (SOI) substrate and methods of manufacture.

BACKGROUND

Silicon-on-insulator (SOI) substrates introduce harmonics into radio-frequency (RF) switches. Particularly, when an RF switch is formed on an SOI wafer, there can be undesirable device characteristics as a result of induced harmonics. An SOI wafer (also called an SOI substrate) includes an insulator layer on a silicon (Si) substrate and a semiconductor material layer on the insulator layer. In an RF circuit, the silicon layer provides that active components that can be wired together using any standard IC technology. The insulator layer may be a buried oxide (BOX) layer. The BOX layer is on top of a handle Silicon wafer, e.g., substrate, that typically is of higher resistivity in nature to reduce RF coupling. The interface between the BOX layer and the handle wafer (e.g., substrate) constitutes an inversion layer due to a fixed positive charge in the oxide and an induced negative mobile charge in the substrate. This mobile charge can react to the voltage signals produced by the active devices or wires themselves. This voltage response behavior of the handle wafer can be characterized as a variable capacitor (or varactor). An RF device such as a field effect transistor (FET) or wire formed in the silicon on the BOX carrying an RF signal will modulate the handle wafer varactor behavior, leading to non-linearities in the signal. This non-linear coupling causes unwanted distortions in the signal.

Selectively damaging regions in the Si substrate interrupts the inversion layer, which can interrupt the substrate coupling. For example, a trench may be formed in the BOX and an inert ion may be implanted at a high dose into the Si substrate through the trench. As an illustrative example, argon (Ar) may be implanted at an energy of 30 keV and a dose of $5e15/cm^3$. This disrupts the interface between the BOX and the substrate and reduces substrate coupling. However, this technique is not effective for isolating a FET island, such as that used with an RF switch, because the inert implant does not diffuse laterally under the FET. As such, the trench and implant technique is not useful for active devices such as an RF switch.

Accordingly, there exists a need in the art to overcome the deficiencies and limitations described hereinabove.

SUMMARY

In a first aspect of the invention, there is a method of fabricating a semiconductor structure. The method includes forming at least one trench through an insulator layer. The at least one trench is adjacent a device formed in an active region on the insulator layer. The method also includes forming at least one cavity in a substrate under the insulator layer and extending laterally from the at least one trench to underneath the device.

In another aspect of the invention, there is a method of fabricating a semiconductor structure. The method includes: forming a semiconductor-on-insulator (SOI) wafer including a silicon substrate, an insulator layer on the substrate, and an active semiconductor layer on the insulator layer; forming an active field effect transistor (FET) device in the active semiconductor layer; and disrupting an interface between the substrate and the insulator layer at a location directly underneath the active FET device.

In accordance with further aspects of the invention, there is a semiconductor structure including: a substrate; an insulator layer on the substrate; an active device formed in an active semiconductor layer on the insulator layer; at least one trench extending through the insulator layer; and at least one cavity in the substrate. The at least one cavity is below the insulator layer and extends laterally from the at least one trench to a location that is vertically aligned with the active device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a semiconductor structures and methods of manufacture and, more particularly, to an integrated circuit having a low harmonic radio-frequency (RF) switch in a silicon-on-insulator (SOI) substrate and methods of manufacture. In accordance with aspects of the invention, an active device such as an RF switch is isolated by etching trenches in the buried oxide (BOX) around the sides of the active device and then isotropically etching the silicon substrate under the active device. The isotropic etch process etches the silicon substrate in all directions, including laterally under the active device. In this manner, the BOX-substrate interface is interrupted or even removed altogether under the active device, which results in less substrate coupling. Accordingly, implementations of the invention may be used to improve device performance by reducing signal distortion.

In embodiments, harmonic issues are eliminated by forming air cavities under critical switch devices using a lateral undercut technique comprising an STS deep silicon etch tool. In further embodiments, an access trench is opened through the BOX region that is located adjacent to the active device that requires isolation. An isotropic etch solution is introduced into the trench to perform a lateral undercut of the silicon that underlies the BOX under the active device. After performing the undercut, the access trench is filled and planarized. A silicon etcher, such as those manufactured by Surface Technology Systems (STS) of Redwood City, Calif., can be utilized to practice such isotropic etching.

In embodiments, the undercut is formed after the active device has already been formed in the active semiconductor layer on the BOX. That is to say, the active device is first formed, and then the lateral undercuts are formed in the substrate under the already-formed active device. This ordering of processing steps avoids the formation of thermal-induced stresses around the lateral undercut that may otherwise result from the thermal processing (e.g., annealing) involved in the device formation.

Figure 1:
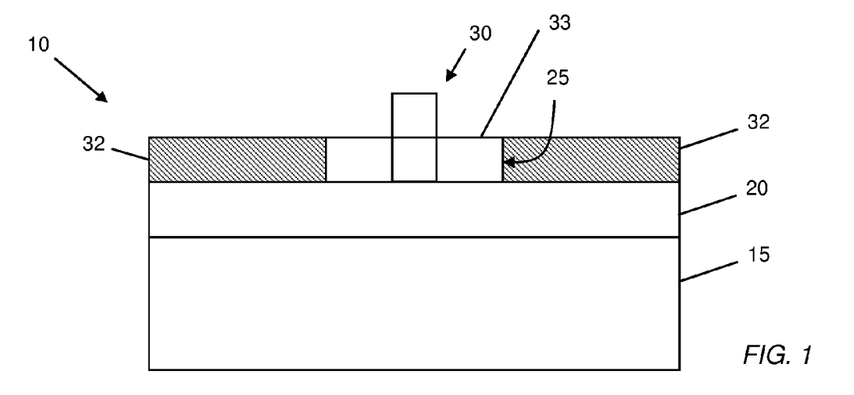
FIGS. 1-24 show processing steps and structures associated with aspects of the invention.

FIGS. 1-24 show processing steps and structures associated with forming a semiconductor device in accordance with aspects of the invention. Specifically, FIG. 1 shows an exemplary SOI wafer 10 employed as an intermediate structure in implementations of the invention. The SOI wafer 10 has a bulk semiconductor substrate 15, which is typically a silicon substrate, a buried oxide (BOX) layer 20 formed on the substrate 15, and a semiconductor layer 25, which is typically a silicon layer, formed on the BOX layer 20. The SOI wafer 10 may be fabricated using techniques well know to those skilled in the art. For example, the SOI wafer 10 may be formed by conventional processes including, but not limited to, oxygen implantation (e.g., SIMOX), wafer bonding (e.g., the "SMART CUT" method, which is a registered trademark of S.O.I.TEC Silicon On Insulator Technologies of Bernin, France), etc.

The constituent materials of the SOI wafer 10 may be selected based on the desired end use application of the semiconductor device. For example, the substrate 15 may be composed of any suitable silicon based material including, but not limited to, Si, SiGe, SiGeC, SiC, GE alloys. The BOX layer 20 may be composed of, for example, $SiO_2$. Moreover, although the SOI wafer 10 is referred to as "silicon on insulator," the semiconductor layer 25 is not limited to silicon. Instead, the semiconductor layer 25 may be comprised of various silicon based semiconductor materials, such as, for example, Si, SiGe, SiC, SiGeC, etc.

In embodiments, the SOI wafer 10 has a thickness of about 700 μm, with the BOX layer 20 having a thickness of about 1 μm (1000 nm), and the semiconductor layer 25 having a thickness of about 0.15 μm (150 nm). However, the invention is not limited to these dimensions, and the various portions of the SOI wafer 10 may have any desired thicknesses based upon the intended use of the final semiconductor device.

Still referring to FIG. 1, an active FET device 30 is formed on and/or in a portion of the semiconductor layer 25. Well known CMOS processing techniques are utilized to define the semiconductor portion. The active semiconductor is isolated on all 4 sides by using the traditional shallow-trench isolation (STI) technique. Typically, the STI 32 is built using an oxide material. The device 30 may comprise, for example, an RF switch; however, the invention is not limited to this type of device, and aspects of the invention may be used with any desired devices. In the embodiment illustrated in FIG. 1, the semiconductor layer 25 comprises an island 33 that is surrounded by STI regions 32 and BOX layer 20. The invention is not limited to this configuration, however, and the semiconductor layer 25 may take other forms, such as extending across a substantial entirety of the top of the wafer 10.

Figure 2:
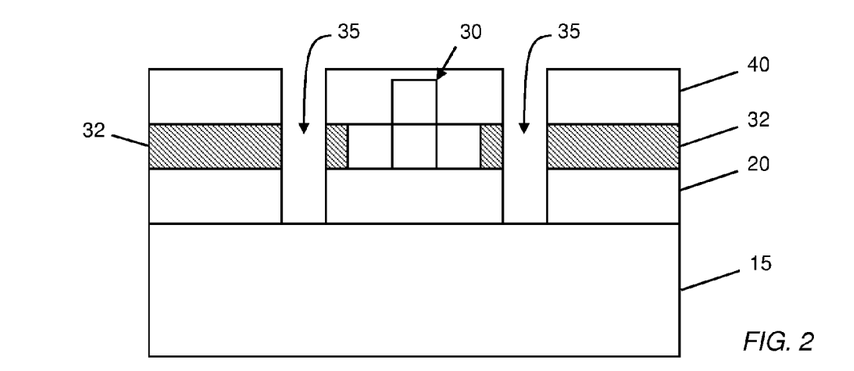

As depicted in FIG. 2, trenches 35 are formed in the STI 32 and the BOX layer 20 adjacent the device 30. The trenches 35 extend through the entirety of the BOX layer 20 to the underlying substrate 15. The trenches 35 may be formed using any suitable semiconductor fabrication techniques, including but not limited to: masking and etching, laser ablation, gas cluster ion beam, etc. In a particular embodiment, the trenches 35 are formed by applying a patterned mask 40 on the structure and removing material of the BOX layer 20 through the patterned mask 40 via an etch process. The mask 40 may be composed of, for example, a photoresist material, a hard mask material, or any other suitable masking layer. In embodiments, the etch process is anisotropic and selective to silicon so that the etching occurs in a substantially vertical direction through the device STI region 32 and the BOX layer 20 and stops at the silicon substrate 15. In particular embodiments, an oxide reactive ion etch (RIE) process is utilized. Alternatively to employing an etch that is highly selective to the underlying substrate 15, a less selective etch may be used that is timed and/or stopped at the substrate 15 using endpoint detection, such as measuring the intensity of a desired wavelength with an optical spectrometer.

Figure 3:
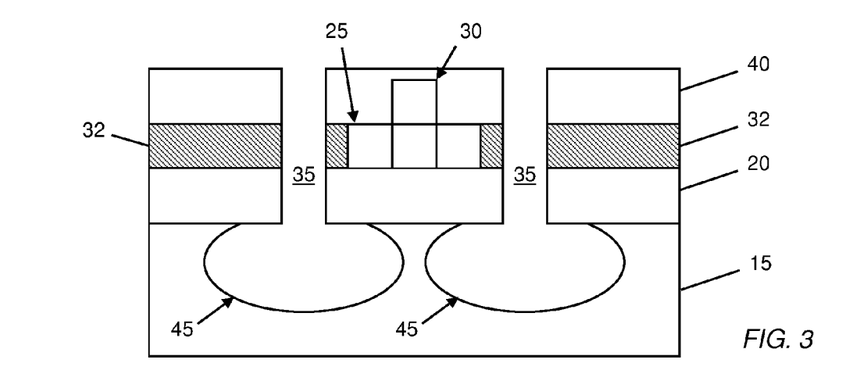

FIG. 3 depicts the formation of cavities 45 in the substrate 15 under the BOX layer 20 and partially or completely under the device 30 in accordance with aspects of the invention. In embodiments, the cavities 45 are performed by isotropically etching the silicon substrate 15 through the trenches 35. The mask 40 may be left in place to protect the device 30 and semiconductor layer 25 during the etching of the substrate 15. The isotropic etch process etches the silicon substrate 15 in substantially all directions outward from the trench 35, including extending laterally from the bottom opening of the trench to a location directly under the device 30, such that the cavities are at least partially vertically aligned with the device. As shown in FIG. 3, the cavities 45 are below and at least partially vertically aligned with the device 30, such that the cavities 40 interrupt the BOX-substrate interface at a location directly underneath the device 30. This interruption reduces substrate coupling and improves device performance.

In embodiments, the etch process that is used to etch the substrate 15 is selective to oxide such that the BOX layer 20 is not removed. Any desired etch process that is both isotropic and targeted to the substrate 15 relative to the BOX layer 20 may be used within the scope of the invention. For example, typical etch chemistry may use gases such as sulfur hexaflouride ($SF_6$) with a flow rate in the range of about 300+/−50 sccm, chamber pressure in the range of abut 30+/−10 milliTorr, RF power in the range of about 2000+/−500 Watts, with a total etch time ranging from about 10-60 sec, depending on the dimensionality for the undercut expected in feature 45.

Figure 4:
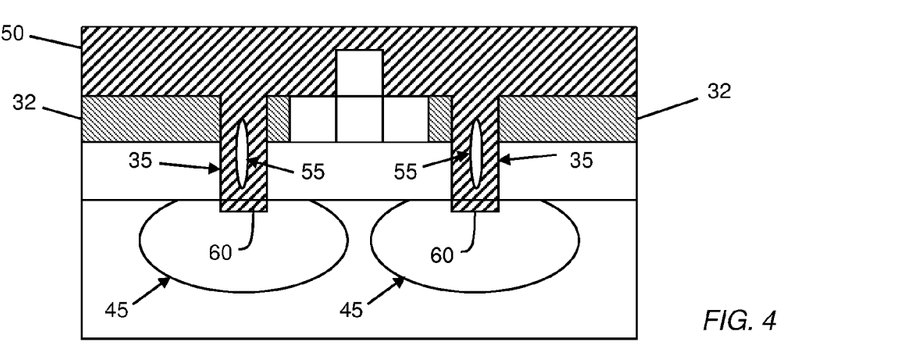

As shown in FIG. 4, the mask 40 is removed and the trenches 35 are at least partially filled with a dielectric material 50. The dielectric material 50 may comprise, but is not limited to, borophosphosilicate glass (BPSG), undoped polysilicon, etc. The dielectric material 50 may be deposited in any suitable manner, such as chemical vapor deposition (CVD), atomic layer deposition (ALD), molecular layer deposition (MLD), low-pressure chemical vapor deposition (LPCVD), plasma enhanced chemical vapor deposition (PECVD), etc., and may be planarized using a chemical mechanical polish (CMP). The deposition process may or may not result in the formation of voids 55 in the dielectric material 50 in the trenches 35 and/or extensions 60 of the dielectric material 50 into the cavities 45. In embodiments, however, the dimensions of the trenches 35 and the cavities 45 are chosen in conjunction with the fill process parameters of the dielectric material 50 to ensure that the cavities 45 remain mostly devoid of the dielectric material 50.

Figure 5:
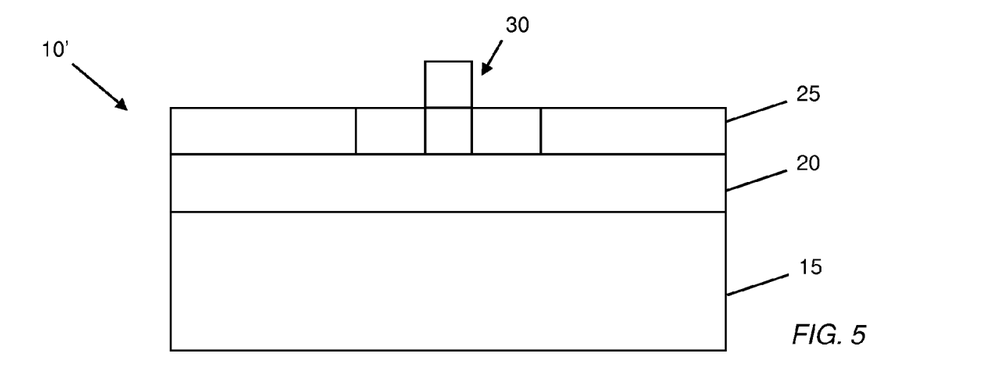

FIG. 5 shows an alternative starting structure in accordance with aspects of the invention. As depicted in FIG. 5, a wafer 10' comprises a silicon substrate 15, BOX layer 20, semiconductor layer 25, and a device 30 formed in the semiconductor layer 25. In contrast to FIG. 1, the semiconductor layer 25 extends across a substantial entirety of the BOX layer 20 such that the semiconductor layer 25 is arranged adjacent the lateral sides of the device 30.

Figure 6:
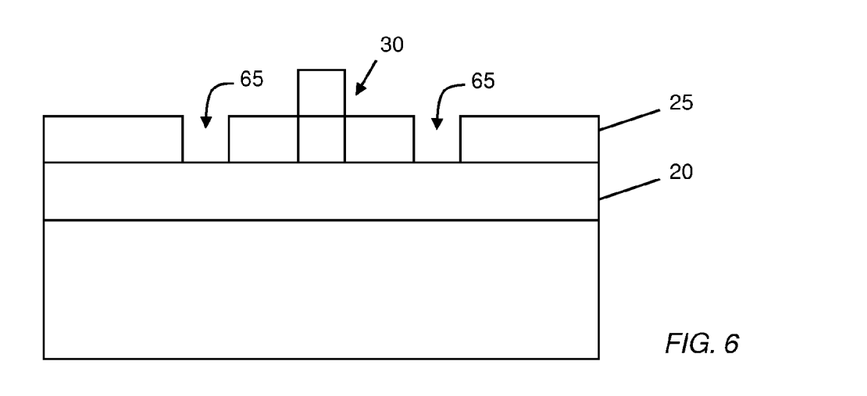

As depicted in FIG. 6, trenches 65 are formed in the semiconductor layer 25 adjacent the device 30. The trenches 65 may be formed using any suitable semiconductor fabrication techniques, including but not limited to: masking and etching, laser ablation, gas cluster ion beam, etc. In a particular embodiment, the trenches 65 are formed using photolithographic masking and etching comprising: applying a photoresist layer (not shown) on the structure; exposing the photoresist to a pattern of radiation and developing the photoresist utilizing a resist developer to form a pattern therein; and removing material of the semiconductor layer 25 through the patterned photoresist layer via an etch process. In embodiments, the etch process is anisotropic and selective to oxide so that the etching occurs in a substantially vertical direction through the semiconductor layer 25 and stops at the BOX layer 20. Alternatively to employing an etch that is highly selective to the underlying BOX layer 20, a less selective etch may be used that is timed and/or stopped at the BOX layer 20 using endpoint detection, such as measuring the intensity of a desired wavelength with an optical spectrometer.

Figure 7:
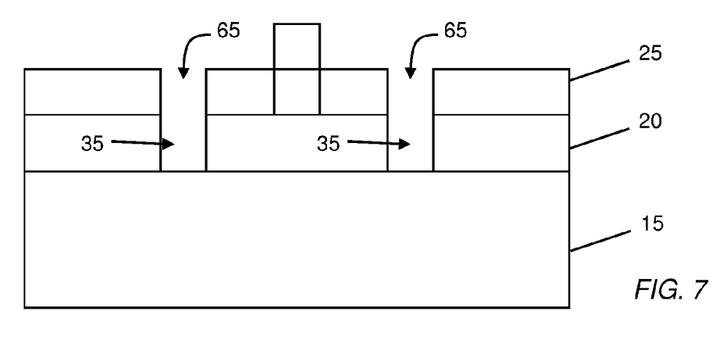

As depicted in FIG. 7, trenches 35 are formed in the BOX layer 20. The trenches 35 extend to the underlying substrate 15 and may be formed in a manner similar to that described above with respect to FIG. 2. For example, in embodiments, the trenches 35 are formed by performing an anisotropic oxide RIE process through and in substantial alignment with the existing trenches 65 in the semiconductor layer 25. The trenches 65 and 35 combine to form a trench from the top of the structure down to the upper surface of the substrate 15.

Figure 8:
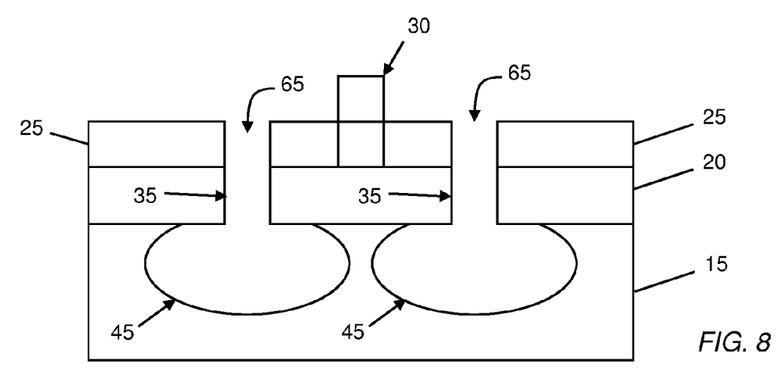
Figure 9:
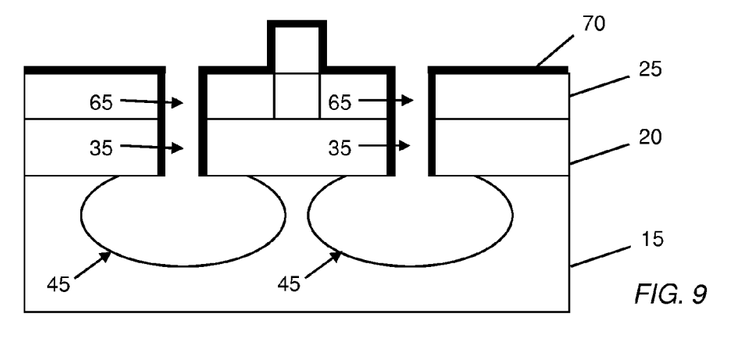

According to aspects of the invention, as illustrated in FIG. 8, cavities 45 are formed in the substrate. The cavities 45 may be formed in a manner similar to that described above with respect to FIG. 3. For example, in embodiments, the cavities 45 are created by performing an isotropic silicon etch through the trenches 35 and 65. In embodiments, the isotropic etch process that is used to etch the substrate 15 is selective to the material of the BOX layer 20, such that essentially only the silicon substrate 15 is etched during this process. As depicted in FIG. 9, a nitride film 70 that is typically employed in the fabrication process for protecting devices from moisture and other undesired elements, may be conformally deposited over the exposed surfaces of the semiconductor layer 25 and the device 30. Layer 70 may be composed of any suitable material, such as silicon nitride, and may be formed using any suitable fabrication technique, such as CVD, ALD, MLD, LPCVD, PECVD, etc. In embodiments, the layer 70 is formed after the cavities 45.

Figure 10:
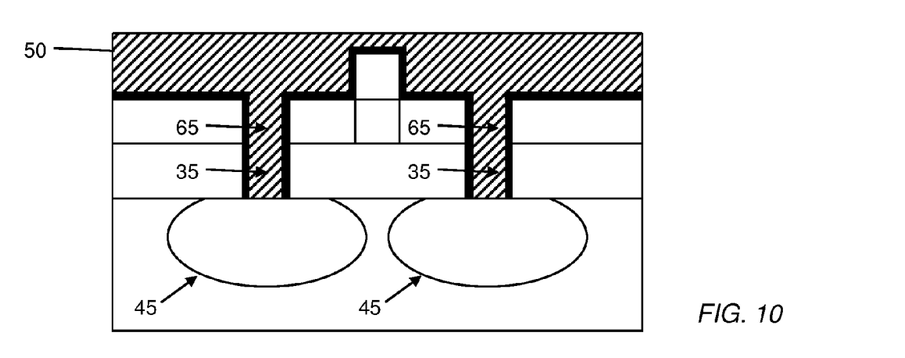

As depicted in FIG. 10, the trenches 35 and 65 are filled with a dielectric material 50. The dielectric material 50 may be formed in the same manner and may be composed of the same materials as that described above with respect to FIG. 4. As with the embodiment described above with respect to FIG. 4, the formation of the dielectric material 50 may or may not result in the formation of voids in the dielectric material 50 in the trenches and/or extensions of the dielectric material 50 into the cavities 45. In embodiments, the dielectric material 50 is planarized using CMP.

Figure 11:
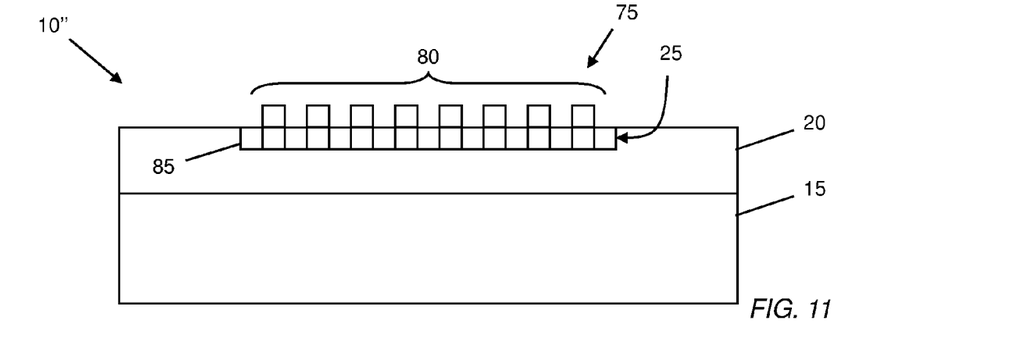

FIG. 11 shows an alternative starting structure in accordance with aspects of the invention. As depicted in FIG. 11, a wafer 10" comprises a silicon substrate 15, BOX layer 20, semiconductor layer 25, and an active device such as an RF switch 75 formed in the semiconductor layer 25. In embodiments, the RF switch 75 comprises a plurality of polysilicon lines 80 on an island 85 composed of the active semiconductor layer 25. The invention is not limited to an RF switch, but rather other active devices may be used.

Figure 12:
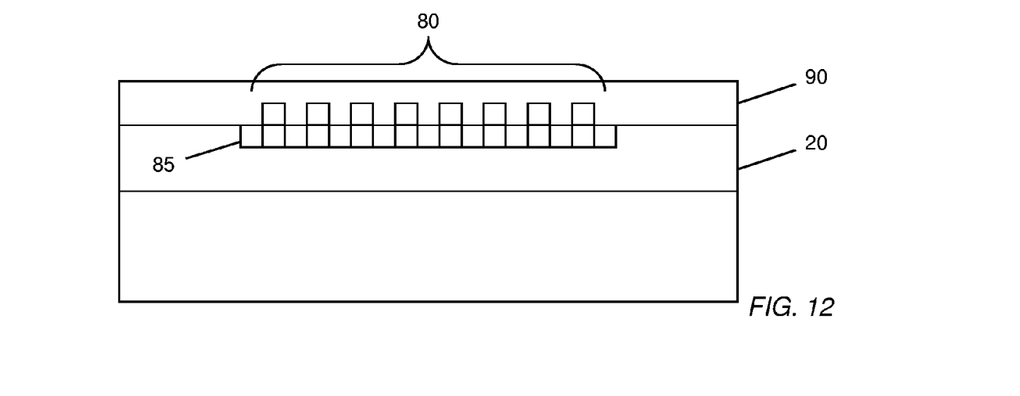

As shown in FIG. 12, in embodiments, a mask 90 is formed on the exposed top surfaces of the structure, including over the polysilicon lines 80, island 85, and BOX layer 20. The mask 90 may be formed using a photoresist or a dielectric film. For example, a dielectric film that is etch resistant to the isotropic silicon etch may be deposited uniformly by conventional techniques, such as CVD, ALD, MLD, LPCVD, PECVD, etc., and may be composed of any suitable material, such as nitride, and more specifically silicon nitride.

Figure 13:
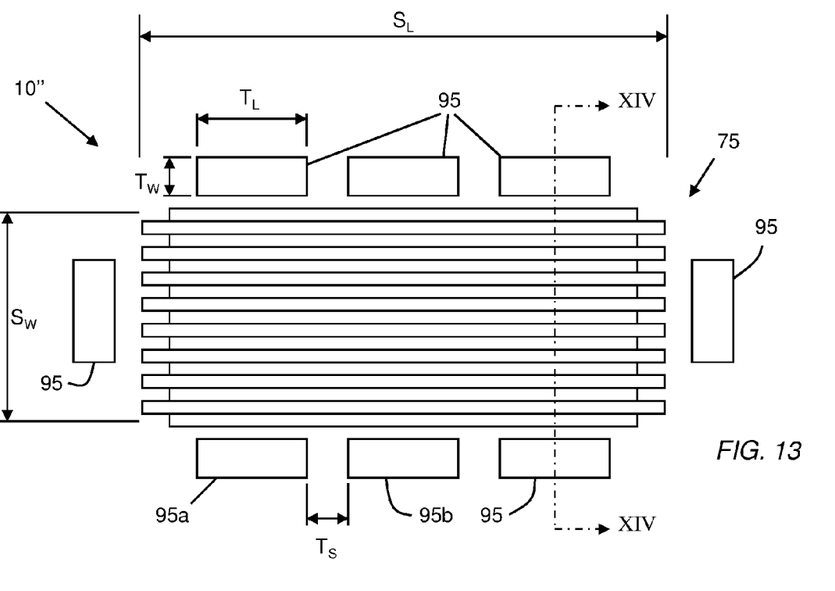
Figure 14:
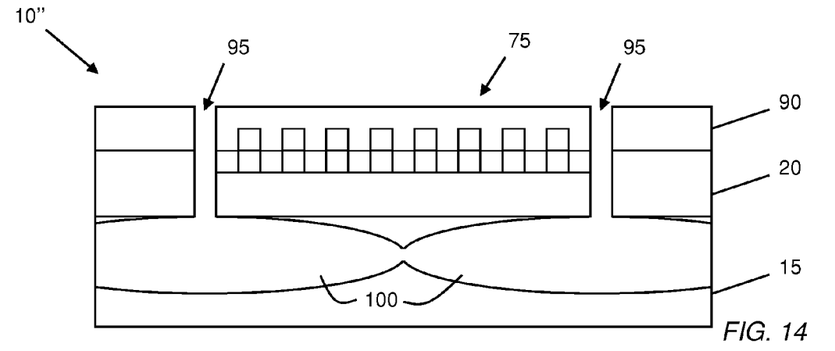

FIGS. 13 and 14 show respective views of the wafer 10" after a plurality of trenches 95 have been formed through the mask 90 and BOX layer 20, and also after cavities 100 have been formed in the substrate 15. Particularly, FIG. 13 shows a top-down view (i.e., plan view) and FIG. 14 shows a cutaway view of the structure of FIG. 13 taken along line XIV-XIV. As seen in FIGS. 13 and 14, the trenches 95 extend through the mask 90 and BOX layer 20 down to the upper surface of the silicon substrate 15. As further depicted in FIG. 14, the cavities 100 are formed in the substrate 15 underneath the RF switch 75. The trenches 95 may be formed in any desired manner, including one or more anisotropic etching processes, such as those already described herein. Also, the cavities 100 may be formed by an isotropic etch process performed through the trenches, as already described herein. The walls of trenches 95 may be lined with a nitride dielectric as already described herein.

In accordance with aspects of the invention, the number of trenches 95 and the spacing of the trenches 95 around the RF switch 75 are chosen such that isotropic etching of the substrate creates the cavities 100 under the RF switch, the cavities 100 being large enough to reduce substrate coupling without rendering the wafer structurally (e.g., mechanically) unstable. In the illustrative example shown, the RF switch 75 has a length $S_L$ of about 100 μm and a width $S_w$ of about 10 μm, and there are three trenches 95 along the long sides of the RF switch 75 and a single trench 95 along each short side of the RF switch 75. The length and width of the trenches 95 are not critical, but should be of sufficient size to permit etching of the substrate through the trenches 95. In embodiments, each trench 95 has a width $T_W$ of about 1 to 2 μm and a length $T_L$ of about 20 to 25 μm. The invention is not limited to these dimensions of the RF switch 75 and trenches 95, and any suitable dimensions may be used within the scope of the invention.

According to aspects of the invention, the spacing $T_s$ between adjacent trenches, e.g., trenches 95a and 95b, is about ten to twenty times the width of the trenches. For trenches having a width of about 1 to 2 μm, the spacing between adjacent trenches is about 10 to 20 μm. Such spacing between trenches accommodates isotropic etching of the substrate between trenches to preserve the structural/mechanical soundness of the chip. More specifically, when the substrate is isotropically etched as described herein, the etch process erodes the silicon substrate between adjacent trenches. Since the isotropic etch travels in substantially all directions, the isotropic etch process from one respective trench travels toward an adjacent trench, and vice versa. As such, the spacing between adjacent trenches is chosen so that sufficient silicon will remain to support the RF switch after the isotropic etch.

For example, in embodiments, the isotropic etch process travels about 2 to 5 μm in the lateral direction from the edge of the trench through which the etch is performed. Thus, the etch through trench 95a travels about 2 to 5 μm toward trench 95b, and the etch through trench 95b travels about 2 to 5 μm toward trench 95a. In this manner, about 4 to 10 μm of silicon is removed between trenches 95a and 95b. Accordingly, in embodiments, the spacing $T_s$ between trenches 95a and 95b is chosen to exceed this amount of silicon removal by an amount that is sufficient to maintain the structural integrity of the chip. In embodiments, two RF switches may be located beside one another on the wafer 10", and a spacing of about 3 to 4 μm is provided between the two switches. It is noted that the particular dimensions described herein are for illustrative purposes and are not intended to limit the invention; rather, any suitable dimensions may be used within the scope of the invention.

Figure 15:
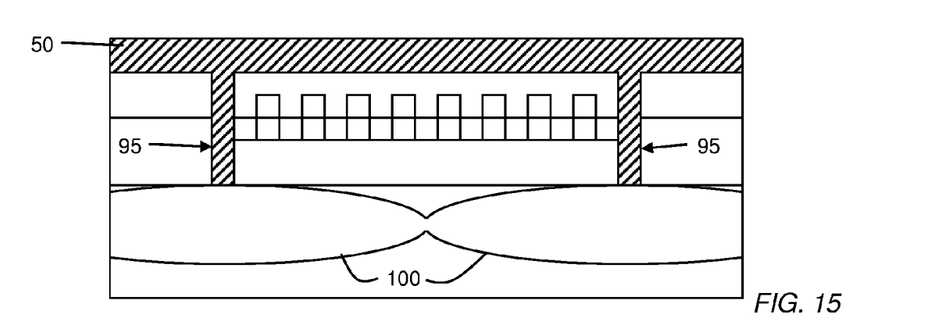

As depicted in FIG. 15, the trenches 95 are filled with a dielectric material 50. The dielectric material 50 may formed in the same manner and may be composed of the same materials as that described above with respect to FIG. 4. As with the embodiment described above with respect to FIG. 4, the formation of the dielectric material 50 may or may not result in the formation of voids in the dielectric material 50 in the trenches and/or extensions of the dielectric material 50 into the cavities 100. In embodiments, the dielectric material 50 is planarized using CMP.

Figure 16:
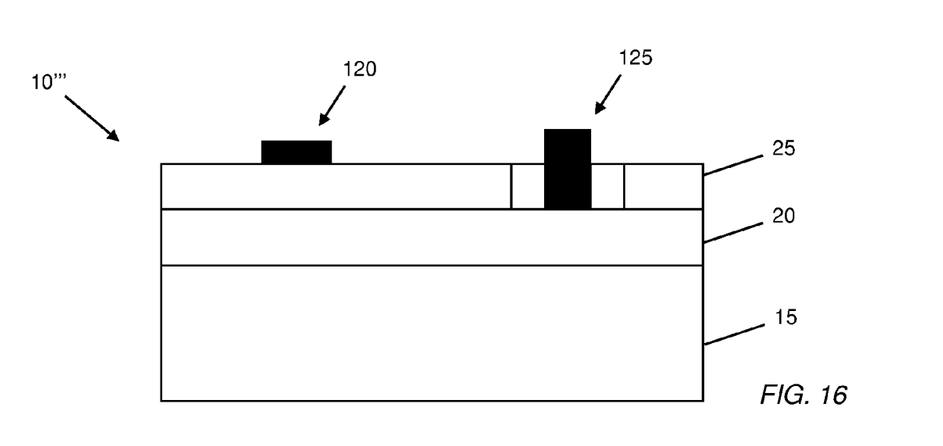

FIG. 16 shows an alternative starting structure in accordance with aspects of the invention. As depicted in FIG. 16, a wafer 10''' comprises a silicon substrate 15, BOX layer 20, semiconductor layer 25, a passive device 120 (e.g., inductor, capacitor, resistor, interconnect, etc.), and an active device 125 (e.g., transistor) formed on/in the semiconductor layer 25.

Figure 17:
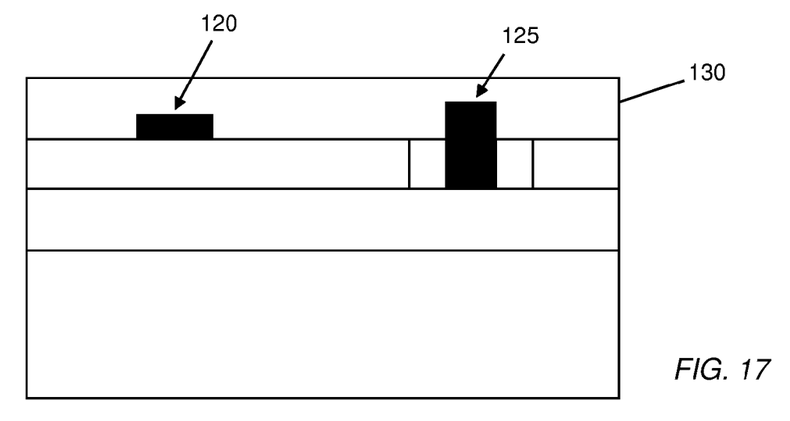

As depicted in FIG. 17, a barrier layer 130 is formed on the upper exposed surfaces of the structure, including over the passive device 120 and active device 125. The barrier layer 130 may be formed in the same manner as layer 90 described above, and may be composed of any suitable material, such as nitride.

Figure 18:
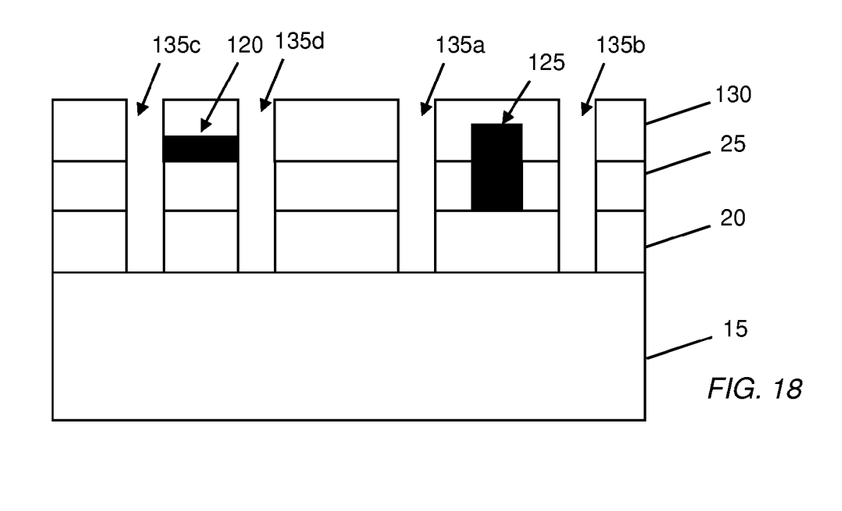

As shown in FIG. 18, trenches 135a-d are formed adjacent the passive device 120 and active device 125. The trenches 135a-d extend substantially vertically through the nitride layer 130, the semiconductor layer 25, and the BOX layer 20, and exposes an upper surface of the substrate 15. The trenches 135a-d may be created as already described herein, such as by performing one or more masking and anisotropic etching processes.

Figure 19:
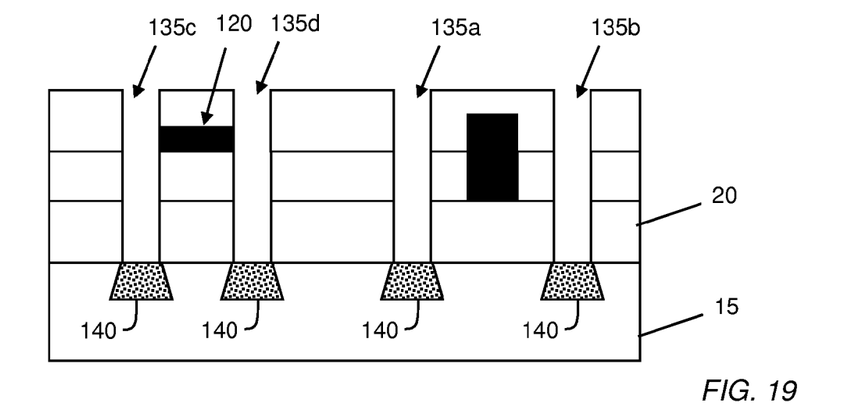

In accordance with aspects of the invention, as depicted in FIG. 19, an inert ion is implanted into the substrate 15 to create damaged areas 140 in the substrate 15 at the interface between the substrate 15 and the BOX layer 20. The ion implant damages the interface between the substrate 15 and the BOX layer 20 to interrupt any inversion layer that may exist. In embodiments, argon (Ar) is implanted into the substrate 15 through the trenches 135a-d, the implant being performed at an energy of about 30 keV and a dose of about $5e15/cm^3$. This disrupts the interface between the BOX layer 20 and the substrate 15 and reduces substrate coupling between the passive device 120 and the substrate 15. The invention is not limited to implanting argon at the described energy and dose, but rather any suitable ion implantation may be performed to disrupt the substrate interface.

Figure 20:
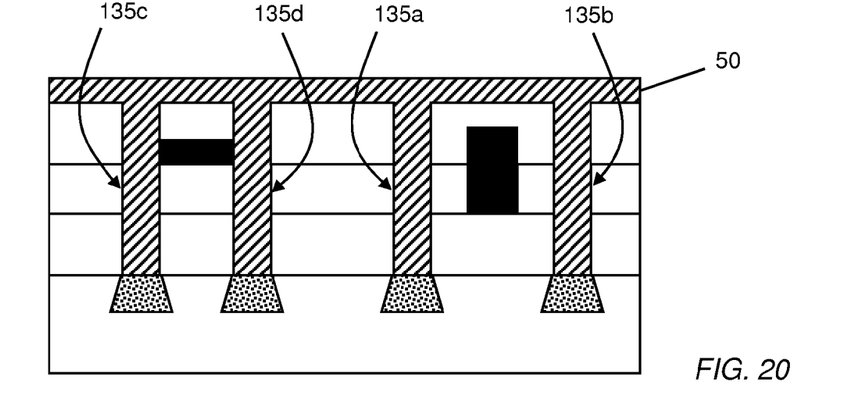

As depicted in FIG. 20, the trenches 135a-d are filled with a dielectric material 50. The dielectric material 50 may formed in the same manner and may be composed of the same materials as that described above with respect to FIG. 4. In embodiments, the dielectric material 50 is planarized using CMP.

Figure 21:
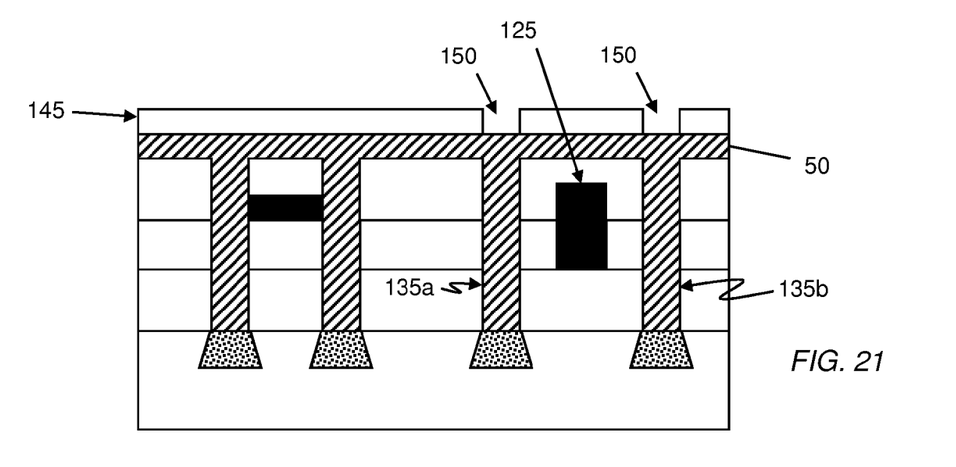

FIG. 21 shows the formation of a patterned mask 145 on the dielectric material 50. In embodiments, the mask 145 is patterned with openings 150 over the trenches 135a and 135b that are adjacent to the active device 125. The mask 145 may be a photolithographic mask, hard mask, or any other suitable mask composed of conventional materials and formed using conventional semiconductor fabrication techniques.

Figure 22:
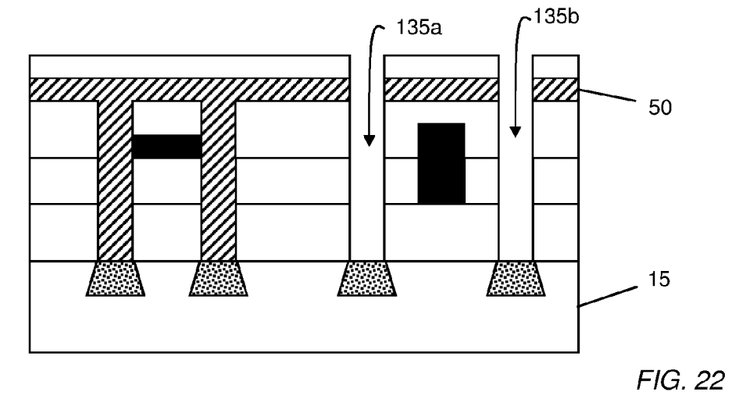

As depicted in FIG. 22, the dielectric material 50 is removed from the trenches 135a and 135b. In embodiments, the dielectric material 50 is removed using a conventional etch process that selectively removes the dielectric material 50. The removal of the dielectric material 50 from the trenches 135a and 135b exposes the upper surface of the substrate 15 through the trenches 135a and 135b.

Figure 23:
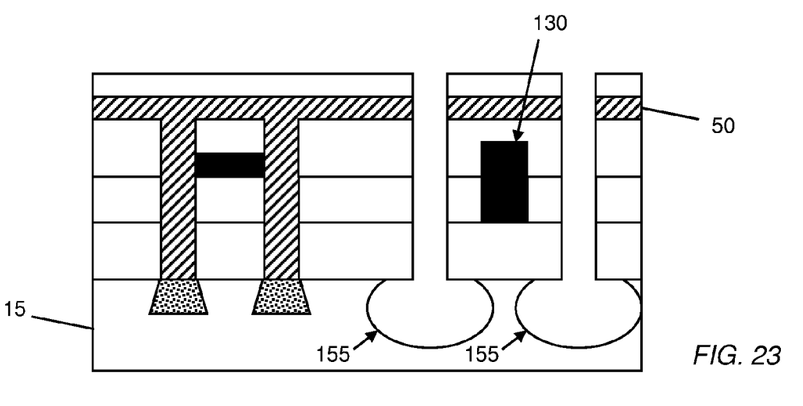

According to aspects of the invention, as illustrated in FIG. 23, cavities 155 are formed in the substrate 15 underneath the active device 130. The cavities 155 may be formed in a manner similar to that described above with respect to FIG. 3. For example, in embodiments, the cavities 155 are created by performing isotropic silicon etching through the trenches 135a and 135b.

Figure 24:
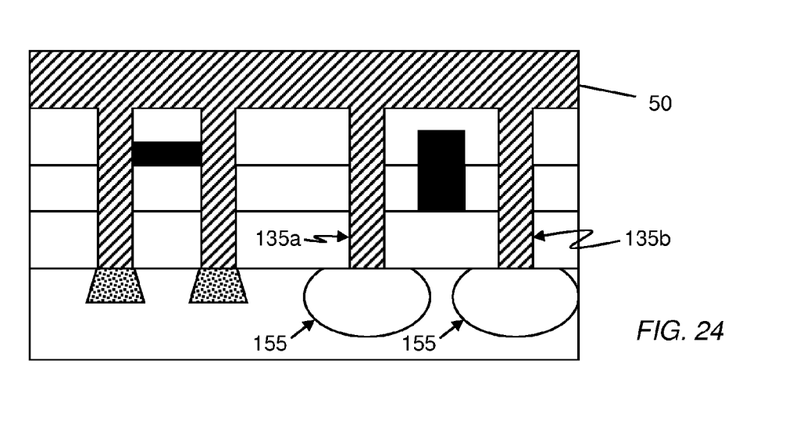

As depicted in FIG. 24, the mask 145 is stripped and the trenches 135a and 135b are filled with a dielectric material 50. The dielectric material 50 may formed in the same manner and may be composed of the same materials as that described above with respect to FIG. 4. As with the embodiment described above with respect to FIG. 4, the formation of the dielectric material 50 may or may not result in the formation of voids in the dielectric material 50 in the trenches and/or extensions of the dielectric material 50 into the cavities 155. In embodiments, the dielectric material 50 is planarized using CMP.

Although different exemplary implementations of the invention have been illustratively described herein, each implementation is not limited to its described structures and/or steps. The structures and/or steps described with respect to one implementation may be used with another implementation. For example, the step of damaging regions of the substrate through ion implantation is not limited to the structures shown in FIGS. 16-24, but rather may be used with any of the structures described with respect to FIGS. 1-15.

Figure 25:
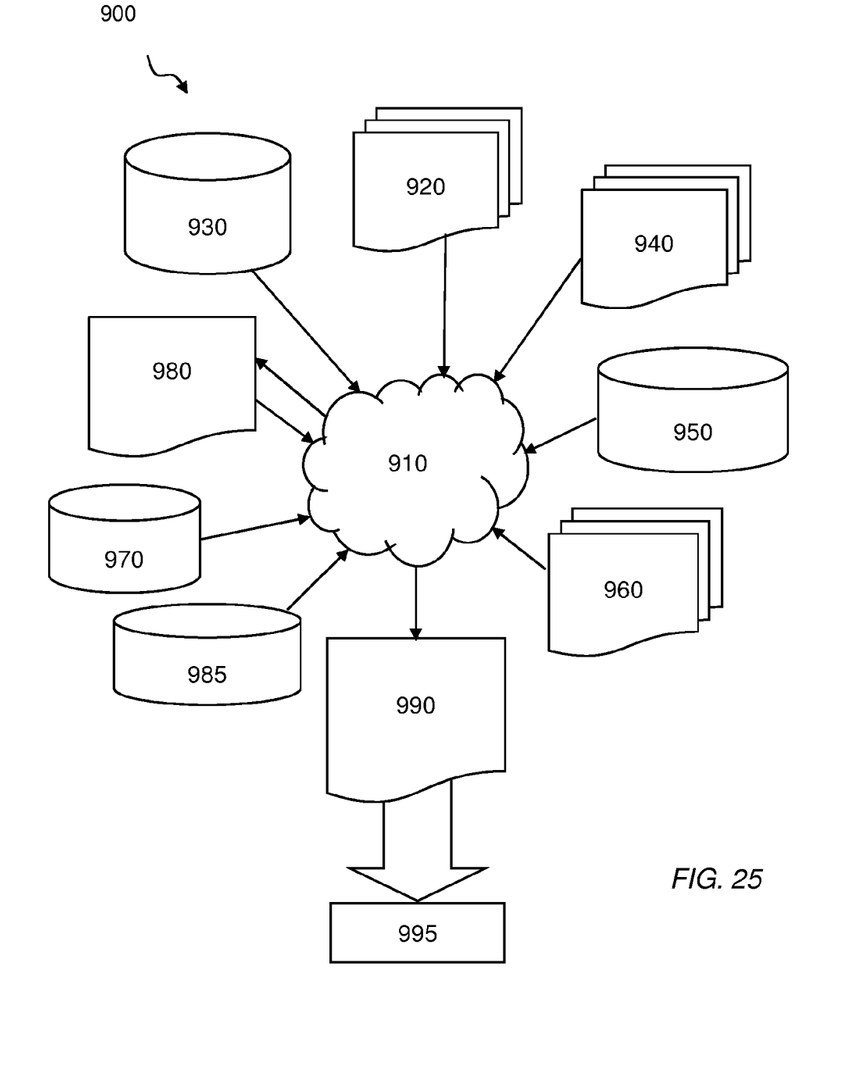
FIG. 25 is a flow diagram of a design process used in semiconductor design, manufacture, and/or test.

FIG. 25 is a flow diagram of a design process used in semiconductor design, manufacture, and/or test. FIG. 25 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-24. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 25 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-24. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-24 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-24. In one embodiment, design structure 990 may comprise a compiled, executable HDL simulation model that functionally simulates the devices shown in FIGS. 1-24.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-24. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of fabricating a semiconductor structure, comprising:
    forming at least one trench through an insulator layer, wherein the at least one trench is adjacent a device formed in an active region on the insulator layer;
    forming a mask on and contacting the device;
    forming at least one cavity in a substrate under the insulator layer and extending laterally from the at least one trench to underneath the device, wherein the at least one cavity interrupts an interface between the substrate and the insulator layer directly beneath the device; and
    filling the at least one trench with a dielectric material without filling the at least one cavity with the dielectric material,
    wherein the forming the mask is performed before the forming the at least one cavity, and the mask protects the device during the forming the at least one cavity.

2. The method of claim 1, wherein the forming the at least one cavity comprises isotropically etching the substrate through the at least one trench.

3. The method of claim 2, wherein the forming at least one trench comprises anisotropically etching the insulator layer.

4. The method of claim 2, wherein the isotropic etching comprises etching a material of the substrate selective to a material of the insulator layer.

5. The method of claim 1, further comprising:
    removing the mask before the filling the at least one trench.

6. The method of claim 1, wherein the filling the at least one trench with the dielectric material results in at least one of:
    formation of voids in the dielectric material in the at least one trench; and
    extension of the dielectric material into the at least one cavity.

7. The method of claim 1, wherein the at least one trench is formed through a shallow trench isolation region.

8. The method of claim 1, wherein the substrate, the insulator layer, and the active region are comprised in a semiconductor-on-insulator (SOI) wafer.

9. A method of fabricating a semiconductor structure, comprising:
    forming a semiconductor-on-insulator (SOI) wafer including a silicon substrate, an insulator layer on the substrate, and an active semiconductor layer on the insulator layer;
    forming an active field effect transistor (FET) device in the active semiconductor layer;
    forming at least one trench in a shallow trench isolation region and the insulator layer adjacent the active FET device;
    forming a mask on the active FET device and the shallow trench isolation region before the forming the at least one trench; and
    disrupting an interface between the substrate and the insulator layer at a location directly underneath the active FET device.

10. The method of claim 9, wherein the disrupting the interface between the substrate and the insulator layer comprises forming at least one cavity in the substrate beneath the insulator layer and at least partially vertically aligned with the active FET device.

11. The method of claim 10, wherein the forming the at least one cavity in the substrate comprises
    performing an isotropic etch of the substrate through the at least one trench.

12. The method of claim 9, further comprising at least partially filling the at least one trench with a dielectric material after the disrupting the interface.

13. The method of claim 9, further comprising:
    removing the mask after the disrupting the interface.

14. A semiconductor structure, comprising:
    a substrate;
    an insulator layer on the substrate;
    an active device formed in an active semiconductor layer on the insulator layer;
    at least one trench extending through a shallow trench isolation region and the insulator layer; and
    at least one cavity in the substrate, wherein the at least one cavity is below the insulator layer and extends laterally from the at least one trench to a location that is vertically aligned with the active device, and the at least one cavity interrupts an interface between the substrate and the insulator layer beneath the device,
    wherein the at least one trench is filled with dielectric material, and further comprising voids in the dielectric material in the at least one trench.

15. The structure of claim 14, wherein at least one cavity reduces substrate coupling between the active device and the substrate.

16. The structure of claim 14, wherein the substrate, the insulator layer, and the active semiconductor layer are comprised in a semiconductor-on-insulator (SOI) wafer.

17. The structure of claim 14, wherein the active device comprises an RF switch.

18. The structure of claim 14, wherein the shallow trench isolation region defines an island on which the active device is formed.

19. The structure of claim 14, further comprising
    extensions of the dielectric material into the at least one cavity.

* * * * *